United States Patent
Blomberg

(10) Patent No.: US 9,235,043 B2
(45) Date of Patent: Jan. 12, 2016

(54) MICROMECHANICAL TUNABLE FABRY-PEROT INTERFEROMETER, AN INTERMEDIATE PRODUCT, AND A METHOD FOR PRODUCING THE SAME

(75) Inventor: Martti Blomberg, Vtt (FI)

(73) Assignee: TEKNOLOGIAN TUTKIMUSKESKUS VTT, Vtt (FI)

( * ) Notice: Subject to any disclaimer, the term of this patent is extended or adjusted under 35 U.S.C. 154(b) by 1037 days.

(21) Appl. No.: 13/319,337

(22) PCT Filed: May 28, 2010

(86) PCT No.: PCT/FI2010/050434
§ 371 (c)(1),
(2), (4) Date: Nov. 8, 2011

(87) PCT Pub. No.: WO2010/136654
PCT Pub. Date: Dec. 2, 2010

(65) Prior Publication Data
US 2012/0050751 A1     Mar. 1, 2012

(30) Foreign Application Priority Data
May 29, 2009 (FI) ........................ 20095602

(51) Int. Cl.
G02B 27/00 (2006.01)
G02B 26/00 (2006.01)
B81B 3/00 (2006.01)
G01J 3/26 (2006.01)

(52) U.S. Cl.
CPC ............ *G02B 26/001* (2013.01); *B81B 3/0013* (2013.01); *G01J 3/26* (2013.01); *B81B 2201/042* (2013.01); *B81C 2201/115* (2013.01)

(58) Field of Classification Search
None
See application file for complete search history.

(56) References Cited

U.S. PATENT DOCUMENTS

| | | | |
|---|---|---|---|
| 5,622,900 A | 4/1997 | Smith | |
| 5,825,528 A | 10/1998 | Goossen | |
| 6,295,130 B1 | 9/2001 | Sun et al. | |
| 7,012,726 B1 | 3/2006 | Miles | |
| 2003/0116711 A1 | 6/2003 | Hara et al. | |
| 2004/0081498 A1 | 4/2004 | Tu | |
| 2004/0164423 A1* | 8/2004 | Sherrer | 257/774 |
| 2007/0170540 A1 | 7/2007 | Chung et al. | |
| 2007/0242358 A1 | 10/2007 | Lin et al. | |

FOREIGN PATENT DOCUMENTS

WO    WO 01/14248    3/2001

OTHER PUBLICATIONS

Chin-Piao Chang et al., "A 16-Channel Array-Type Microspectrometer Using Integrated Fabry-Perot Etalons and Lateral Pin Photodetectors", Sensors, 2003, Proceeding of IEEE, pp. 675-678.

(Continued)

*Primary Examiner* — Arnel C Lavarias
(74) *Attorney, Agent, or Firm* — Mark M Friedman

(57) ABSTRACT

Controllable Fabry-Perot interferometers include two mirrors with a space between them. The mirrors are such that at least one layer is made of silicon-rich silicon nitride. Additionally, the mirrors' surfaces are formed to be of a roughness which reduces the risk of the mirrors sticking to each other.

20 Claims, 3 Drawing Sheets

(56) References Cited

OTHER PUBLICATIONS

A. Ruf et al., "A Miniturised Fabry Perot AFM Sensor", Solid-State Sensors and Actuators, 1995, pp. 66-663.

Guo Dagang et al., Design and Optimization of Dual Optical Fiber MEMS Pressure Sensor for Biomedical Applications, Journal of Physics : Conference 34 (2006), pp. 1073-1078.

* cited by examiner

MICROMECHANICAL TUNABLE FABRY-PEROT INTERFEROMETER, AN INTERMEDIATE PRODUCT, AND A METHOD FOR PRODUCING THE SAME

TECHNICAL FIELD

The invention relates to a Fabry-Perot interferometer and a method for producing a Fabry-Perot interferometer. More specifically, the invention relates to tunable Fabry-Perot interferometers which are produced with micromechanical (MEMS) technology.

BACKGROUND TECHNOLOGY

Fabry-Perot interferometers are used as optical filters and in spectroscopic sensors, for example. A Fabry-Perot interferometer is based on parallel mirrors, whereby a Fabry-Perot cavity is formed into a gap between the mirrors. The pass band wavelength of a Fabry-Perot interferometer can be controlled by adjusting the distance between the mirrors i.e. the width of the gap. It is common to use micromechanical technology for producing Fabry-Perot interferometers. Such a solution is described e.g. in patent document FI95838.

One such prior art structure of a micromechanical interferometer usually includes layers of silicon and silicon oxide, wherein mirrors of the interferometer have silicon oxide layer(s) between silicon layers. A movable mirror is provided by removing a sacrificial layer, which has initially been formed between two mirror layers. The sacrificial layer may be e.g., silicon dioxide, which can be removed by etching with hydrofluoric acid (HF), for example. In order to allow the etching substance to reach the sacrificial layer, holes are provided in the movable mirror. The position of a moveable mirror is controlled by applying voltage to electrodes, which are included in the mirror structures.

The micromechanical production technology allows series production of interferometers. However, there are some disadvantages related with the prior art solutions for production of interferometers and the interferometer components.

In order to prevent the silicon oxide layers of the mirrors to be etched during the etching of the sacrificial layer, silicon layers are provided between the sacrificial layer and the silicon oxide layers of the mirrors. However, when the sacrificial layer is etched through the holes of the movable mirror the silicon oxide layers may also become etched at the edges of the holes. In order to prevent the silicon oxide layer from becoming etched in the etching process of the sacrificial layer the silicon oxide layer can be removed by patterning around the areas of the holes before the upper layers are deposited. This way a silicon layer forms the edges of the through-holes. The removed area of silicon dioxide may have e.g., three times larger diameter size compared to the diameter of a hole. However, this causes that the released mirror to be not evenly thick at all locations, and the mirror has an inhomogeneous structure. While the mirror inevitably has a tensile stress, this will further cause bending of the mirror, which degrades the performance of the mirror. Providing the holes also requires several patterning/etching phases since the silicon dioxide layers must be patterned and etched separately.

The silicon layers at the surfaces of the mirrors also tend to have small holes, i.e. pinholes. During the etching of the sacrificial layer, it is therefore possible that the etching agent, such as HF, enters through the pinholes into the silicon oxide layers of the mirrors. If these layers are etched, the structure of the mirrors is deteriorated.

The density of the pinholes in the silicon layers is dependent on the roughness of the surface of the silicon layer. In order to minimize the density of pinholes, the degree of roughness of the silicon layers is made as low as possible. However, when the surfaces of the mirrors are smooth, there is an increased risk of the mirrors sticking to each other if they touch each other. The mirrors may touch each other during the use or transportation, for example. For example, instantaneous overvoltage at the control circuit of the component or high humidity may cause the mirrors to stick permanently to each other and thus cause the component to become non-functional.

A further problem relates to removing the sacrificial layer between the mirrors, In prior art processes the removal is a separate process which must be made before the interferometers can be cut out from the wafers and encapsulated. Such a separate process increases the complexity of the production process. Also, the cutting, encapsulating and transportation of the interferometers require special handling because of the movable, released mirror. A released mirror is sensitive to environmental stress, such as changes of temperature or humidity, contamination, and the like.

As a result of these disadvantages, the yield of interferometers in the production may be low, and reliability of the produced interferometers possibly does not reach a required level.

SUMMARY OF THE INVENTION

The purpose of the present invention is to avoid or reduce disadvantages of the prior art.

The object of the invention is achieved with a solution, in which a tunable Fabry-Perot interferometer has silicon-rich silicon nitride in at least one layer of a mirror. The use of silicon oxide in the mirror layers can thus be avoided or reduced. With this inventive solution it is possible to avoid the above mentioned problems related with the prior art.

A controllable Fabry-Perot interferometer according to the invention, comprising a substrate, a first mirror structure on the substrate, a second, movable mirror structure, whereby the first and second mirror structures comprise first and second mirrors which are substantially parallel, a Fabry-Perot cavity between the first and second mirrors, whereby the cavity has been formed by providing a sacrificial layer between the first and second mirror structures before providing the second mirror structure, and removing the sacrificial layer after providing the second mirror structure, electrodes for electrical control of the distance between the mirrors, is characterised in that at least one said mirror has a layer of silicon-rich silicon nitride.

A method according to the invention for producing a controllable Fabry-Perot interferometer, wherein a substrate is provided, a first mirror is provided on the substrate, a second, movable mirror structure is provided, whereby the first and second mirror structures comprise first and second mirrors which are substantially parallel, a Fabry-Perot cavity is provided between the first and second mirrors, whereby providing the cavity comprises providing a sacrificial layer between the first and second mirror structures before providing the second mirror structure, and the sacrificial layer is removed after providing the second mirror structure, providing electrodes for electrical control of the distance between the mirrors, is characterised in that at least one layer of at least one said mirror is made of silicon-rich silicon nitride.

Significant advantages can be achieved with the invention when compared to the prior known solutions. In an inventive Fabry-Perot interferometer it is not necessary to use silicon oxide layers in the mirrors. Therefore, the etching of the sacrificial layer does not deteriorate the mirror layers. It is therefore possible to provide the etching of the holes in the movable mirror after all mirror layers at the optical area have been deposited, and thus it is possible to etch at least two layers of different material, preferably all layers of the movable mirror, within the same etching phase. As the etching does not deteriorate the layers of the movable mirror it is possible to remain straight edges in the holes which are made to the movable mirror for etching the sacrificial layer. The movable mirror has thus a homogeneous structure and keeps its even form. It is also possible to include a higher density of etching holes in the movable mirror, which improves the etching process and whereby HF vapour etching can be used.

When the sacrificial layer is removed with HF vapour etching, this can be performed after cutting the chips and possibly also after encapsulating the chips. This allows simple cutting and packaging procedures because the movable mirror does not need to be released at that phase and is therefore not sensitive to environmental stress, such as changes of temperature or humidity, contamination, etc. Also, it is possible to transport the interferometers in normal transportation manners because the movable mirrors can be released after the transport.

Secondly, it is possible to allow a higher density of pinholes in the mirror layers because the etching agent is not harmful to any of the mirror layers. Therefore, it is possible to apply higher roughness at the mirror surfaces, whereby the risk of the mirrors sticking to each other is decreased. As a consequence of these advantages, higher yield can be achieved in the production of Fabry-Perot interferometers, and the high functional reliability of interferometers can be achieved.

It is further possible to determine the index of refraction by adjusting the contents of silicon in the silicon-rich silicon nitride. By adding silicon to silicon nitride the value of the index of refraction is increased compared to the pure silicon nitride. By applying silicon-rich silicon nitride wherein the value of the index refraction is closer to the corresponding value of the polycrystalline silicon layer, a same optical effect is achieved by implementing the mirror with a larger number of $\lambda/4$ layers. This way it is possible to achieve a mirror structure which is thicker and stronger compared to, for example, structures where silicon oxide layers are used. Preferably, the silicon-rich silicon nitride of a mirror layer has such a proportion of silicon that the material has a value of the index of refraction which value is between the corresponding values of polycrystalline silicon and silicon nitride.

It is also possible to adjust the tensile stress of the silicon-rich silicon nitride layer by adjusting the contents of silicon in the layer. By adjusting the tensile stress it is possible to optimise the control properties of an electrostatic-controllable mirror. Layers of silicon-rich silicon nitride can be produced with e.g. low pressure chemical vapour deposition (LPCVD) process, wherein the contents of silicon in the layer can be controlled. Principles for controlling silicon contents in producing silicon-rich silicon nitride films with LPCVD process is described in e.g., the document, "LPCVD silicon-rich nitride films for applications in micromechanics, studied with statistical exneurimental design." in J. Vac. Sci. Technol. A 14(5) September/October 1996, pp. 2879-2892, This document also discloses how refractive index and tensile stress vary as a function of the silicon contents in a silicon-rich silicon nitride film.

The interferometers according to the invention are well suited for near infrared radiation (NIR), but they can be designed for the usage for any other radiation within optical range as well; infrared radiation (IR) and visible light. It is only necessary to choose materials for the substrate and the mirror structures which are transparent for the operating wavelength.

In this patent application the term "mirror" means a structure where there is a layer or a set of layers which reflects light.

In this patent application the terms "radiation" or "light" are used to mean any radiation in the optical range of wavelengths.

In this patent application "gap width" means the distance between the mirrors at the concerned position.

In this patent application "sacrificial layer" means a material layer which is at least partially removed in the final product.

SHORT DESCRIPTION OF THE DRAWINGS

In the following part the preferable exemplary embodiments of the invention are described in more detail by referring to the enclosed drawings, in which.

DETAILED DESCRIPTION OF THE EMBODIMENTS

Figure 1:
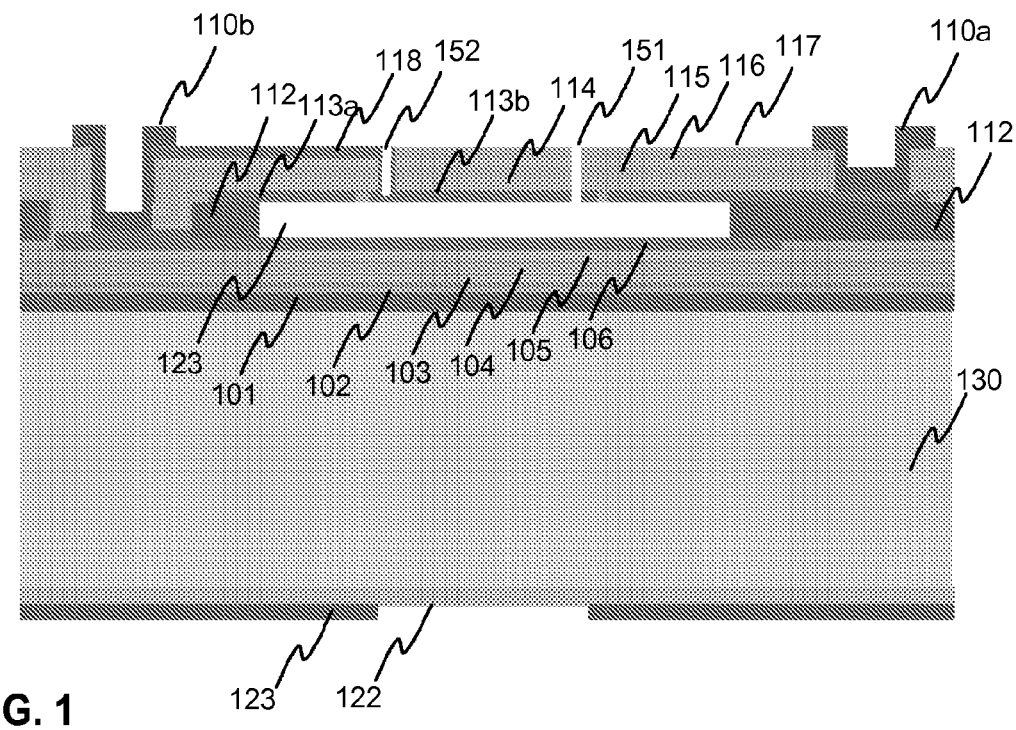
FIG. 1 illustrates a cross section of an exemplary Fabry-Perot interferometer according to the invention.

FIG. 1 illustrates a cross section of an exemplary Fabry-Perot interferometer according to the invention. The interferometer has a substrate 130 of e.g. monocrystalline silicon material, on which there is an optical matching layer 101 of e.g. silicon oxide. The reflecting layers of the fixed mirror are provided by layers 102-105, wherein layers 102 and 104 are of polycrystalline silicon, and layers 103 and 105 are of silicon-rich silicon nitride. Patterned layer 106 is made of doped polycrystalline silicon and serves as a control electrode of the fixed mirror.

The interferometer has a second, movable mirror which has reflecting layers 114-117. Layers 115 and 117 are of polycrystalline silicon, and layers 114 and 116 are of silicon-rich silicon nitride. Layer 113a, 113b is made of doped polycrystalline silicon and serves as electrically conducting control electrodes of the fixed mirror.

The electrode 106 of the lower, fixed mirror is electrically connected to the connection 110b. The centre electrode 113b of the movable mirror is connected to the same potential with the lower electrode. In this way it is possible to avoid a potential difference between the centre parts of the movable and fixed mirrors. If potential difference would exist, this could cause an uneven offset into the position of the centre part of the movable mirror. The centre electrode 113b of the movable mirror is connected to the electrical contact 110b with a lead-in 152 through other layers of the movable mirror, and via a patterned conductor layer 118 of doped polycrystalline silicon at the top of the movable mirror. The outer electrodes 113a of the movable mirror are electrically connected to another control connection 110a of the interferometer. The electrical connections 110a, 110b are made of aluminium, for example. The movable mirror has also through-holes 151 for etching the sacrificial layer. As shown in FIG. 1, all layers of the movable mirror around the hole reach the edge of the hole.

The doped conductor structures of the mirrors may alternatively be located at opposite mirrors, i.e. the double layer structure may locate at the lower, fixed mirror, and the single layer structure may locate at the upper, movable mirror.

The cavity of the interferometer is formed by the space 123, from which sacrificial silicon oxide layer has been removed. The sacrificial layer is etched e.g. by vapour HF through holes 151 of the second mirror structure. The second mirror will thus become movable. The silicon oxide layer has been removed from the optical area of the interferometer but it is not removed from the edges 112 of the silicon oxide layer. The remaining silicon oxide layer between the edges of the movable upper mirror and the lower fixed mirror serves as a support for the movable upper mirror. The silicon oxide keeps the movable mirror in a straight and uniform position. It is thus preferable to use the silicon oxide layer also as a support for the movable layer, but it is also a possible alternative to provide the support for the movable mirror by applying a supporting layer above and over the edges of the movable mirror. Such a support can be made of aluminium, for example.

At the opposite surface of the substrate there is a protective layer 122 of silicon-rich silicon nitride, which also serves as an antireflection layer. An aperture for radiation is formed by a patterned layer 123 of e.g. aluminium or some other material which does not transmit radiation within the operating range of the interferometer.

In the structure described above the radiation penetrates through the substrate 130, and the substrate must therefore be transparent for radiation of operative wavelength range of the interferometer. However, it is also possible to deposit an interferometer structure of two minors directly on a detector, such as a pin diode. In this case it is not necessary to use a transparent substrate.

Figure 2:
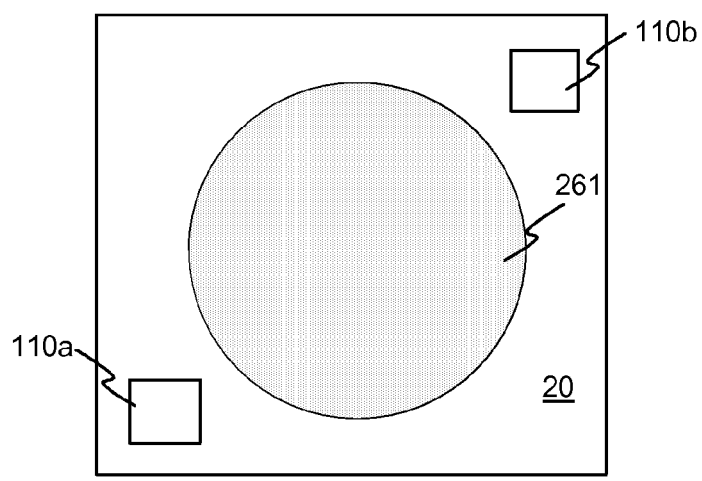
FIG. 2 illustrates a top view of an exemplary electrically tunable Fabry-Perot interferometer according to the invention.

FIG. 2 illustrates a top view of an exemplary electrically tunable Fabry-Perot interferometer 20 according to the invention. The contacts 110a and 110b for the electrodes of the upper and lower mirrors are located at corners of the interferometer. The optical area 261 is circular, and the upper, second mirror is provided with holes which have been used for removing the sacrificial layer. The holes are preferably evenly distributed across the optical area of the second mirror. The diameter of each hole may be e.g. 100 nm-5 µm. The holes may cover an area of 0.01%-5% of the optical area of the second mirror. Such holes function mainly as reflecting mirrors and do not therefore have substantial effect on the performance of the interferometer.

Figure 3:
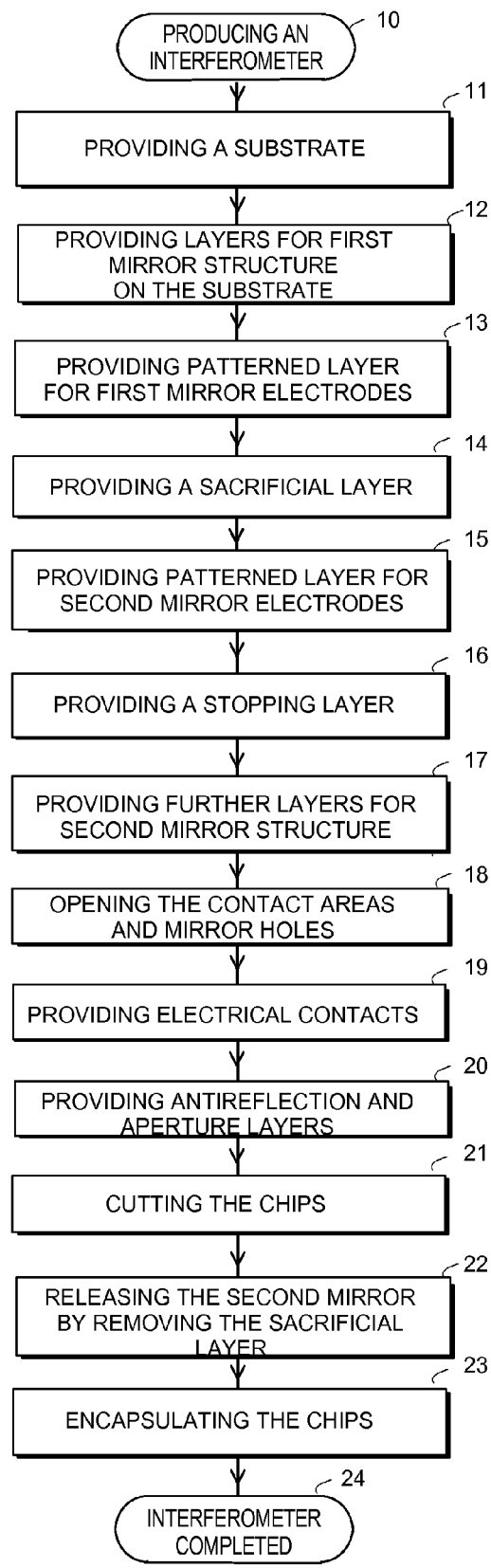
FIG. 3 illustrates a flow diagram of an exemplary process according to the invention for producing an electrically tunable Fabry-Perot interferometer.

FIG. 3 illustrates a flow diagram of an exemplary method according to the invention for producing an electrically tunable Fabry-Perot interferometer, such as an interferometer of FIGS. 1 and 2. In the following description reference numbers of FIGS. 1 and 2 are shown in brackets.

The production process, of producing and Interferometer of phase 10, is started by providing a wafer (130) in phase 11. The wafer material can be e.g. monocrystalline silicon or fused silica. Next layers (102-106) of the first, fixed mirror structure are provided on the substrate. The first minor structure can be produced by e.g. depositing successive layers of polycrystalline silicon and silicon-rich silicon nitride on the substrate, phase 12. For example, there may be two layers (103, 105) of silicon-rich silicon nitride between three layers (102, 104, 106) of polycrystalline silicon. The thickness of the layers can be e.g, 10 nm - 2 µm, The actual thickness of the layers depends on the range of wavelengths at which the interferometer needs to be functional. The thickness of the layers is typically a quarter or a half of the operating wavelength of the radiation within the material of the concerned layer. These layers can be deposited on the substrate by LPCVD process, for example. The topmost layer (106) of the first, fixed mirror is a patterned layer of doped polycrystalline silicon and serves as an electrode for controlling the movable mirror. In the method of FIG. 3, this electrically conductive layer is produced in phase 13.

In phase 14 a patterned sacrificial layer (112) is provided. The sacrificial layer is removed at the area of the electrical contact of the electrode of the fixed mirror. The sacrificial layer will define the Fabry-Perot cavity. The sacrificial layer is of silicon dioxide, and the thickness of the sacrificial layer is defined by the required distance between the mirrors of the interferometer.

In phase 15 a patterned layer (113a, 113b) of doped polycrystalline silicon is provided. This electrically conductive layer serves as an electrode (113a) at the edges of the Fabry-Perot cavity for controlling the position of the movable mirror. The layer also serves as an electrode (113a) for avoiding electrical charging phenomena at the centre part of the movable mirror. The layer further serves as an optical layer of the second, movable mirror.

Next in phase 16 a patterned layer of e.g. aluminium oxide is produced on the polycrystalline silicon layer for providing a stopping layer at the position of the electrical contacts for the electrodes. This procedure of providing electrical contacts is further described in connection with FIG. 4.

In phase 17 further layers (114-117) for the second, movable mirror are formed. These further layers may include, for example, a layer (114) of silicon-rich silicon nitride, a layer (115) of polycrystalline silicon, a layer (116) of silicon-rich silicon nitride, and a layer (117) of polycrystalline silicon. The thickness of the layers can be e.g. 10 nm-2 µm. The actual thickness of the layers depends on the range of wavelengths at which the interferometer needs to be functional. The thickness of the layers is typically a quarter or a half of the operating wavelength of the radiation within the material of the concerned layer. These layers can be deposited by LPCVD process, for example.

Next in phase 18 the electrical contact areas (110a, 110b) and required through-holes (151) and lead-ins (152) are opened by etching the layers of the movable mirror until the stopping layer of e.g. aluminium oxide. This procedure is further described in connection with FIG. 4. In etching the through-holes, a hole is etched into at least two layers of different material, preferably all layers around the hole of the movable mirror, within a same etching phase. In phase 19 electrode contacts are formed. First a conducting layer (118) of doped polycrystalline silicon is provided for wiring, and then a patterned layer of aluminium is provided for forming the contacts.

In phase 20 a layer (122) of e.g. silicon-rich silicon nitride is deposited on the surface of the wafer, which surface is opposite to the previously mentioned interferometer layers. This protective layer may also serve as an antireflective layer. A further patterned layer (123) of e.g. aluminium is provided for forming an aperture for radiation.

In phase 21 the chips are cut from the wafer. The sacrificial layer is then etched with vapour HF in phase 22 through the holes of the second mirror, When the sacrificial layer is removed from the optical area between the mirrors, the Fabry- Perot cavity (123) is formed and the second, movable mirror is released. Finally, the chips are capsulated in phase 23. The electrical contacts may be bonded, but it is also possible to use the contacts of the Fabry-Perot interferometer chip for soldering without bonding. The interferometer is now complete, at phase 24.

There are several phases in which the sacrificial layer can be removed: before the chip is cut out from the wafer or after the chip is cut from the wafer but before encapsulation of the chip. When the sacrificial layer is not removed before cutting the chips from a wafer, it is possible to use normal cutting procedures since the second mirror is not sensitive to environmental stress, such as changes of temperature or humidity, contamination, etc.

Figure 4:
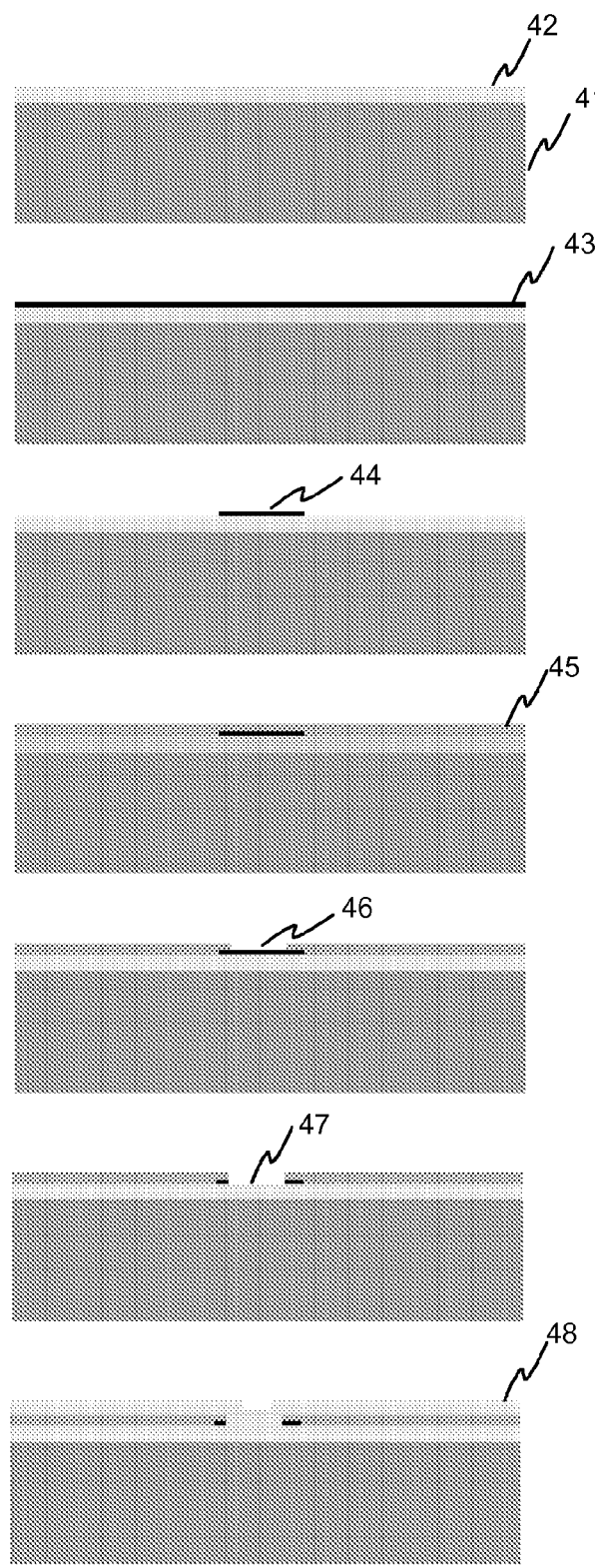
FIG. 4 illustrates an exemplary process for providing an electrical connection through a mirror layer.

FIG. 4 illustrates an exemplary sub-process for providing electrical contacts through layers of a mirror. First, layers 42 of a fixed mirror and the electrode layers of the movable and fixed mirror have been deposited on a substrate 41. The topmost layer forming the conductive electrodes is doped polycrystalline silicon. Then a stopping layer 43 of aluminium oxide is deposited by e.g. an ALD process. Although aluminium oxide is a preferable material, it is alternatively also possible to use other materials for providing the stopping layer, such as silicon dioxide or tantalum oxide. The stopping layer is then patterned, whereby the layer is remained at the location of the electrical contacts 44. A layer 45 of silicon nitride, and possible further layers of silicon nitride or polycrystalline silicon of a mirror are then deposited. These layers of the mirror are etched with plasma at the location of the electrical contacts 46. Several layers silicon nitride and polycrystalline silicon can be etched within a same etching phase. The openings achieved in the layers by etching may include e.g. small apertures or larger areas, possibly also at the edges of the layers. The layer 47 of isolating aluminium oxide is then wet etched with BHF, which does not remove silicon. Finally, an electrically conducting layer 48 of doped polycrystalline silicon or aluminium is deposited. As a result, an electrically conducting contact is produced through non-conducting layers of a mirror.

The invention has been described with the reference to the enclosed embodiments. It is, however, clear that the invention is not restricted only to those, but it comprises all embodiments which can be imagined within the inventive idea and the enclosed patent claims.

For example, some materials, dimensions and forms have been mentioned as examples for implementation of the invention. However, it is clear that dimensions, forms and materials as well as details of structure or phases of production can be changed and optimised for each implementation according to the specific requirements.

Above, the use of aluminium was described as a conductive material forming electrodes electrical wiring and connections. However, it must be noted that is quite possible to use other alternatives of conductive materials, such as copper. Also, monocrystalline silicon has been mentioned as an exemplary preferable material for the substrate. However, it is naturally possible to use other alternative materials.

The inventive interferometers have several preferable applications. They can be used as controllable filters in optical spectrometers, colour analyzers, imagers, optical data communications, and in various devices for measuring e.g. contents of specific gases or liquids.

The invention claimed is:

1. An electrically tunable Fabry-Perot interferometer, comprising:
   a substrate,
   a first mirror structure on the substrate,
   a second mirror structure, which is moveable and the first and second mirror structures comprise first and second mirrors which are substantially parallel,
   a Fabry-Perot cavity between the first and second mirror structures, whereby the cavity has been formed by providing a sacrificial layer between the first and second mirror structures before providing the second mirror structure, and by removing the sacrificial layer after providing the second mirror structure;
   electrodes for electrical control of a distance between the first and second mirror structures, wherein at least one of the mirror structures includes a layer of silicon-rich silicon nitride;
   electrical contacts for the electrodes, wherein at least one of the electrical contacts is through an opening in the layer of silicon-rich silicon nitride,
   wherein said opening has been provided by plasma etching, and the opening is of a depth limited by a stopping layer.

2. The electrically tunable Fabry-Perot interferometer according to claim 1, wherein said at least one mirror of the interferometer has at least three material layers, comprising a first layer of silicon, a second layer of silicon-rich silicon nitride on the first layer, and a third layer of silicon on the second layer.

3. The electrically tunable Fabry-Perot interferometer according to claim 1, wherein the silicon-rich silicon nitride has a value of the index of refraction which is higher than the value of the index of refraction of a pure silicon nitride.

4. The electrically tunable Fabry-Perot interferometer according to claim 1, wherein the silicon in the silicon-rich silicon nitride is in an amount suitable to adjust the tensile stress of the mirror structure.

5. The electrically tunable Fabry-Perot interferometer according to claim 1, wherein said stopping layer includes at least one of: aluminum oxide, silicon dioxide or tantalum oxide.

6. The electrically tunable Fabry-Perot interferometer according to claim 1, wherein the interferometer includes an interferometer chip which has been cut out from a wafer.

7. The electrically tunable Fabry-Perot interferometer according to claim 6, wherein at least a portion of the sacrificial layer has been removed after the interferometer chip has been cut out from the wafer.

8. The electrically tunable Fabry-Perot interferometer according to claim 1, wherein the second mirror includes at least two layers of different material and holes through the at least two layers, whereby each of the at least two layers extends to the edges of the holes.

9. The electrically tunable Fabry-Perot interferometer according to claim 1, wherein the second mirror includes holes, and at least a portion of the sacrificial layer has been removed by etching with vapour hydrofluoric acid (HF) through said holes of the second mirror.

10. A method for producing a controllable Fabry-Perot interferometer, comprising:
   providing a substrate,
   providing a first mirror on the substrate,
   providing a second mirror, said second mirror being moveable, and said first and second mirrors are substantially parallel,
   providing a Fabry-Terot cavity between the first and second mirrors, whereby providing the cavity comprises providing a sacrificial layer between the first and second mirrors, before providing the second mirror structure, and removing the sacrificial layer after providing the second mirror,
   providing electrodes for controlling, a distance between the mirrors, wherein, the electrodes include at least one layer of doped polycrystalline silicon, and at least one layer of the at least one mirror includes a silicon-rich silicon nitride layer, which is patterned by plasma etching of providing electrical contacts through the at least one layer; and, providing a stopping layer on the doped polycrystalline silicon layer for limiting the depth of the plasma etching.

11. The method according to claim 10, wherein at least one of the first or the second mirror of the interferometer includes formation of at least three material layers, comprising: providing a first layer of silicon, providing a second layer of silicon-rich silicon oxide on the first layer, and, providing a third layer of silicon on the second layer.

12. The method according to claim 10, wherein the silicon in the silicon-rich silicon nitride layer is in an amount suitable to provide a value of the index of refraction which is higher than the value of the index of refraction of pure silicon nitride.

13. The method according to claim 10, wherein the contents of silicon in the silicon-rich silicon nitride layer is increased in order to adjust the tensile stress of the at least one mirror.

14. The method according to claim 10, wherein the stopping layer includes a layer of at least one of: aluminum oxide, silicon dioxide or tantalum oxide.

15. The method according to claim 10, additionally comprising:

removing at least a portion of the stopping layer at each of the electrical contacts.

16. The method according claim 10, wherein the substrate includes a wafer on which a plurality of interferometer chips are formed, whereby each of the interferometer chips are cut out from the wafer.

17. The method according to claim 16, wherein at least a portion of the sacrificial layer is removed after the interferometer chips have been cut out from the water.

18. The method according to claim 10, etching holes into the second mirror.

19. The method according to claim 18, wherein the etching includes etching the holes into at least two layers of the second mirror within the same etching phase.

20. The method according claim 18, additionally comprising: etching with hydrofluoric acid (HF) vapour through the holes of the second mirror to remove at least a portion of the sacrificial layer.

* * * * *